United States Patent [19]
Chen

[11] Patent Number: 5,895,961
[45] Date of Patent: Apr. 20, 1999

[54] SEMICONDUCTOR DEVICE WITH A PLANARIZED INTERCONNECT WITH POLY-PLUG AND SELF-ALIGNED CONTACTS

[75] Inventor: Hsiang-Wen Chen, Monte Sereno, Calif.

[73] Assignee: Paradigm Technology, Inc., Milpitas, Calif.

[21] Appl. No.: 08/780,070

[22] Filed: Dec. 23, 1996

Related U.S. Application Data

[63] Continuation of application No. 08/540,730, Oct. 11, 1995, abandoned.

[51] Int. Cl.$^6$ .................................................. H01L 29/76
[52] U.S. Cl. ........................ 257/382; 257/383; 257/754; 257/758
[58] Field of Search ................................ 257/382–385, 257/754–760, 752

[56] References Cited

U.S. PATENT DOCUMENTS

| | | | |
|---|---|---|---|
| 5,166,771 | 11/1992 | Godinho et al. | 257/368 |
| 5,182,225 | 1/1993 | Matthews | 437/58 |
| 5,200,358 | 4/1993 | Bollinger et al. | 437/180 |
| 5,323,047 | 6/1994 | Nguyen | 257/384 |
| 5,340,774 | 8/1994 | Yen | 437/240 |
| 5,348,897 | 9/1994 | Yen | 437/40 |
| 5,381,046 | 1/1995 | Cederbaum et al. | 257/383 |
| 5,530,274 | 6/1996 | Fujioka | 257/306 |

FOREIGN PATENT DOCUMENTS

| | | |
|---|---|---|
| 0071637 | 3/1991 | Japan . |
| 0317358 | 11/1992 | Japan . |

OTHER PUBLICATIONS

K. Tsutsumi et al., "A High–Performance SRAM Memory Cell With LDD–TFT Loads", *1991 Symposium on VLSI Technology, Digest of Technical Papers*, May 28–30, 1991, pp. 23–24.

J. Gambino et al., "A $Si_3N_4$ Etch Stop Process For Borderless Contacts", *Proceedings of the 12th International VLSI Multilevel Interconnection Conference (VMIC)*, Jun. 27–29, 1995, pp. 558–564.

*Primary Examiner*—Peter Toby Brown
*Assistant Examiner*—Roy Potter
*Attorney, Agent, or Firm*—Skjerven, Morrill, MacPherson, Franklin & Friel LLP; Norman R. Klivans

[57] ABSTRACT

A CMOS integrated circuit structure with planarized self-aligned transistors and local planarization in the vicinity of the transistors so as to allow an interconnect, with a planar upper surface, which is free of bridging, has good continuity over the planarized topography and is compatible with self-alignment schemes, hence conserving chip real estate. The structure is compatible with planarization using BPSG, BPTEOS, SOG or CMP. After formation of self-aligned insulated transistor gates and active transistor regions, a "landing pad" is formed on the substrate at the buried contact and polyiso contact locations so as to allow more effective etching at the exact location of the buried contact and polyiso contact. Then the integrated circuit structure is locally planarized by formation of an oxide layer and a reflowed overlying glass layer. The glass layer is etched back to planarize the surface. Then using a polyiso mask, portions of the glass layer and underlying oxide, landing pad, and nitride layers are removed in the area of a gate contact. Then using a buried contact mask, portions of the glass layer and underlying oxide, landing pad, and oxide layers are removed only in the area of the buried contact. Then a combined horizontal and vertical interconnect, with a planar upper surface, is formed to electrically connect the buried contact to the gate.

27 Claims, 6 Drawing Sheets

SEMICONDUCTOR DEVICE WITH A PLANARIZED INTERCONNECT WITH POLY-PLUG AND SELF-ALIGNED CONTACTS

This application is a continuation of application Ser. No. 08/540,730, filed Oct. 11, 1995, now abandoned.

BACKGROUND OF THE INVENTION

1. Field of the Invention

This invention relates to a self-aligned contact and interconnect structure, and method for making same, for use in integrated circuits and particularly in CMOS integrated circuits, having broad applicability in both memory and logic products. More specifically, the invention relates to integrated circuit multi-layer local interconnections where the transistors are self-aligned and a relatively thick planarization layer is formed over the entire surface of the substrate.

2. Description of The Prior Art

In U.S. Pat. No. 5,166,771 (incorporated herein by reference) issued Nov. 24, 1992 and entitled "Self-Aligning Contact and Interconnect Structure", Norman Godinho et al. describe a self-aligned contact structure which allows for high packing density (i.e., more transistors per unit area) of integrated circuits without forcing the production process to finer line geometries and hence higher cost.

The self-aligning source and drain contacts described therein overlap the gate electrode, without shorting the source or the drain to the gate electrode. This overlapping also allows for a looser alignment tolerance requirement thus allowing a smaller size transistor.

Contacts to the polycrystalline silicon ("polysilicon") gate are made on top of the gate region over the active channel, because the source and drain regions are protected by a hardened layer of photoresist during etching of the insulation to expose the gate contact. This allows a reduction in the size of the field of the device which saves valuable silicon area and allows a higher packing density to be obtained in a given integrated circuit.

In one embodiment a layer of titanium silicide covered by a thin film of titanium nitride is formed on the exposed source, drain and polysilicon gate contacts. The silicided areas are formed only in selected locations.

The second layer of polysilicon is deposited and patterned to form local interconnects. The etching process to define the local interconnects does not attack the exposed underlying silicided source, drain and gate contacts in the interconnects. Therefore, the polysilicon local interconnect layer is not required to completely cover and protect the source, drain and gate contacts in the interconnects, reducing alignment tolerance and saving space.

However, this patent (and other well known prior art using self-alignment without surface planarization and high topography) faces the typical problem that as an integrated circuit layout area is reduced it becomes more difficult to ensure a stringer-free (without local bridging) interconnect. This is because of the relatively tight gaps created. Current planarization techniques require the layout area to be enlarged, to allow the local interconnects to make contact to the underlying conductors. This is because as the valleys (for instance between the gate structures) are filled with a planarizing dielectric, it becomes difficult to make electrical contact to the bottoms of the valleys while simultaneously extending the electrical contacts to the tops of the gate structures, without sacrificing semiconductor fabrication process margin.

It is possible to form a self-aligned transistor using relatively small layout areas using interconnects through a thin isolation layers. However, problematically in such a case the surface is not planar due to the relatively thin dielectric, and this results in a relatively high topology, i.e. the gate structures are relatively high steps above the semiconductor substrate surface. In this case when relatively narrow interconnect lines are formed there is frequently a problem with bridging, in that stringers are left on the steps overlying the gate structures. The extreme over etches needed to remove such stringers often undesirably break the continuity of the local interconnect lines.

Therefore, with most prior art self-alignment techniques it is almost impossible to use a thick planarizing dielectric, because such a thick dielectric reduces the process margins, causing one conductor to undesirably contact another conductor in spite of the self-alignment. (In this case, typically a thin planarization dielectric is approximately 1000 to 1500 Å thickness or less, and a thick dielectric is anything greater in thickness.)

Thus in the prior art, local planarization for transistor fabrication is contradictory to self-alignment schemes. It would be desirable to combine the two so as to achieve both the relative economy of self-alignment techniques which reduce the number of masking steps, with the advantages of a planarized surface which allows formation of relatively tight pitched narrow interconnect lines. Planarization is important because it overcomes the continuity problems caused by severe (non-planar) topography, such as varying resistance across a vertical step portions during implantation and poor coverage over a vertical step during silicidization (such as of titanium) or any sputtered metal layer. This combination of self-alignment and local planarization is especially important in semiconductor fabrication techniques using multi-layer local interconnections below the first major and middle interconnect layer, such as used in a planarized BPSG (boro-phosphosilicate glass) or SOG (spun on glass) or CMP (chemically mechanically polished) planarized surface.

In U.S. Pat. No. 5,340,774 (incorporated herein by reference) issued Aug. 23, 1994 and entitled "Semiconductor Fabrication Technique Using Local Planarization with Self-Aligned Transistors", Ting-Pwu Yen describes formation of self-aligned transistors while providing local planarization of the surface of the integrated circuit over the self-aligned transistors. This disclosure provides partial planarization by using an oxide layer and planarizing filler layer, such as reflowed BPSG, over the substrate surface and over the gate structures. The filler layer is etched down to the oxide layer but remains in the valleys between gate structures to planarize the area around a transistors. A polysilicon layer is then formed over the planarized surface. Then portions of the polysilicon and filler layer are removed with an additional polysilicon masking step to allow a buried contact to connect with the active regions of the transistors. Then a polysilicon isolation mask is used to allow contact to the gate structure. Since the filler layer has planarized the area between the buried contact and the gate structure, local interconnects can be formed free of bridging in self-alignment schemes.

However, this method provides only partial local planarization so that additional layers above the local interconnect will suffer the problems described above. In addition the process described in Yen requires an additional masking step which would increase the cost of fabricating ICs using this process. Furthermore, the buried contact region formed through the filler layer is narrow and deep; therefore, it is difficult to make adequate contact to the active regions of the transistors. Consequently, the local interconnect may have a high resistance at that junction.

SUMMARY

In accordance with the invention, self-aligned transistors are fabricated while providing full planarization of the surface of the integrated circuit or semiconductor device without resorting to additional masking steps. This is achieved by a process which first forms on the principal surface of a semiconductor substrate the gate structures and uses those gate structures conventionally to define the locations of the self-aligned active source and drain regions of the transistor in the semiconductor substrate, typically by ion implantation and diffusion.

A "landing pad," formed of polysilicon or other suitable material, is placed over the transistors. Use of an electrically insulating material, such as silicon nitride ($Si_3N_4$) or oxynitride, as the landing pad would allow the elimination of a masking and an etching step in the formation of the landing pad. Then the principal surface of the substrate is initially planarized by forming a planarizing filler layer over the substrate surface and over the gate structures. A gate contact region is then defined through the filler layer by using a "polyiso" (polysilicon isolation) mask to remove a portion of the filler layer overlying a gate. Then a buried contact opening is defined through the filler layer to at least one of the implanted regions by using a buried contact mask to etch a portion of the filler layer overlying the doped region. The remainder of the filler layer remains as defined by the combination of the polyiso and contact masks. A thick polysilicon local interconnect conductive layer is then formed in the contact openings and extending over the adjacent gate structure. This polysilicon interconnect functions as both a horizontal interconnect and a vertical interconnect. The polysilicon interconnect is then etched and its upper surface planarized. This advantageously provides self-alignment in combination with planarization over the active regions of semiconductor substrate, by using the polysilicon interconnect.

Advantageously, the filler layer in the above process is BPSG or other suitable material.

A method in accordance with the present invention planarizes the topography of the integrated circuit, uses a combined vertical and horizontal interconnect, is free of bridging, has better continuity resulting in lower resistance, provides planarization over the active regions of the substrate, and yet is still compatible with self-alignment schemes that are relatively compact. Thus the goal of combining self-alignment with full planarization is achieved.

The above-described method is applicable to any semiconductor fabrication process where interconnects are formed and where it is desirable to form self-aligned transistors. Typically the self-aligned transistors include at least two conductive layers, one overlying another, where the first conductive layer is the transistor gate structure and the second one is an interconnect to the active portions of the transistors.

DETAILED DESCRIPTION OF THE PREFERRED EMBODIMENT

Figure 1:
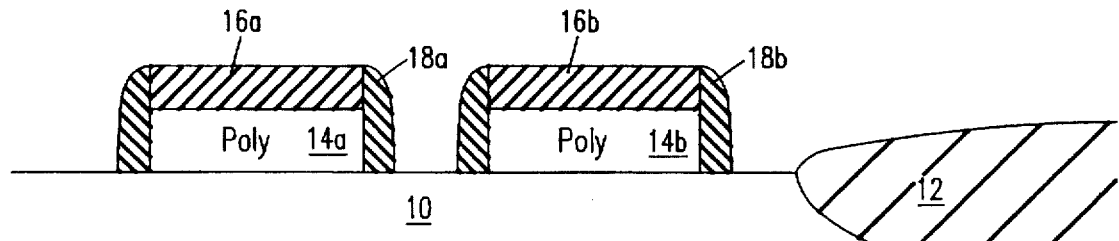
FIGS. 1–17 show in cross-section process steps in fabricating one embodiment of the invention.

FIGS. 1 through 17 show in cross-section process steps for one embodiment in accordance with the present invention. FIG. 1 shows a self-aligned transistor structure for a CMOS integrated circuit. The fabrication steps to form this structure are described in the above-referenced U.S. Pat. No. 5,166,771. Substrate 10 is a doped substrate. Region 12 is a field oxide region. Doped polysilicon conductive gate electrodes 14a and 14b are laterally surrounded by sidewall spacers respectively 18a and 18b formed of silicon dioxide and covered on top by a layer of silicon nitride respectively 16a and 16b. As described in the above-referenced U.S. Pat. No. 5,166,771, also optionally present is a silicon dioxide layer (not shown) located between respectively regions 16b and 14b and between regions 16a and 14a.

Not shown in FIG. 1 for simplicity (but understood as being present) are source and drain regions and optionally lightly doped drain regions all formed in the semiconductor substrate 10 e.g. by ion implantation (as described in the above-referenced U.S. Pat. No. 5,166,771) using a self-aligning process. The dimensions and process parameters set forth in the above-referenced patent are not deemed critical to the present invention.

Figure 2:
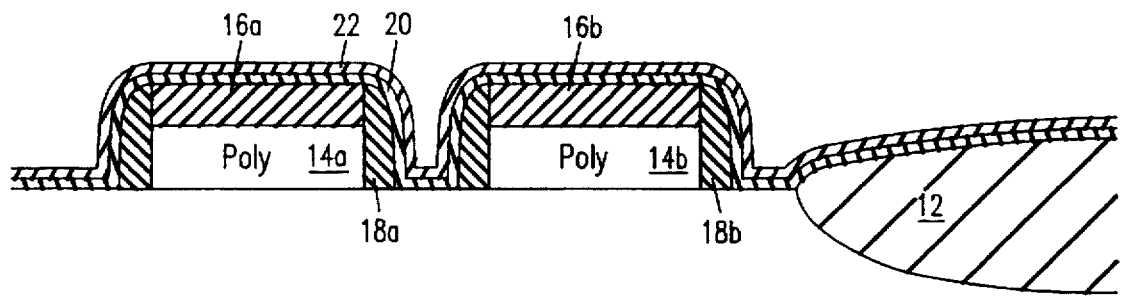
Figure 3:
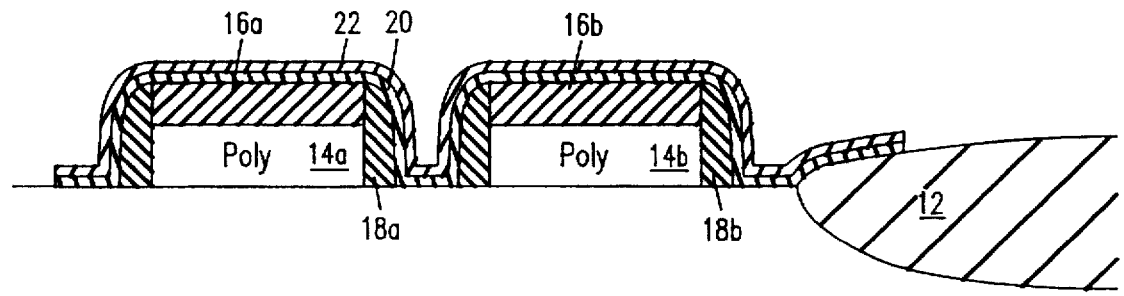

Departing from the process of the above-referenced patent, in FIG. 2 undoped silicon dioxide layer 20 is conventionally deposited by CVD (Chemical Vapor Deposition) to a thickness of about 300–400 Å. A polysilicon layer 22 is deposited to a thickness of about 750 Å, but any thickness of 300–1000 Å is acceptable. Next, polysilicon layer 22 is covered with photoresist (not shown) and masked with a standard poly 2 (second polysilicon layer) mask to form a polysilicon "landing pad." The wafer is then etched with a conventional isotropic etch process or with a combination of isotropic and anisotropic etch processes. FIG. 3 shows the wafer after removal of the photoresist from the wafer.

Alternatively, an insulating etch-resistant material, such as silicon nitride ($Si_3N_4$) or oxynitride can be used to form the landing pad. Using an insulating material for the landing pad would eliminate the need for the masking and etching steps needed to pattern a polysilicon landing pad. However, specialized etching equipment may be necessary to properly use an insulating material as the landing pad; therefore, a polysilicon landing pad should be used if the required etcher is not available.

Figure 4:
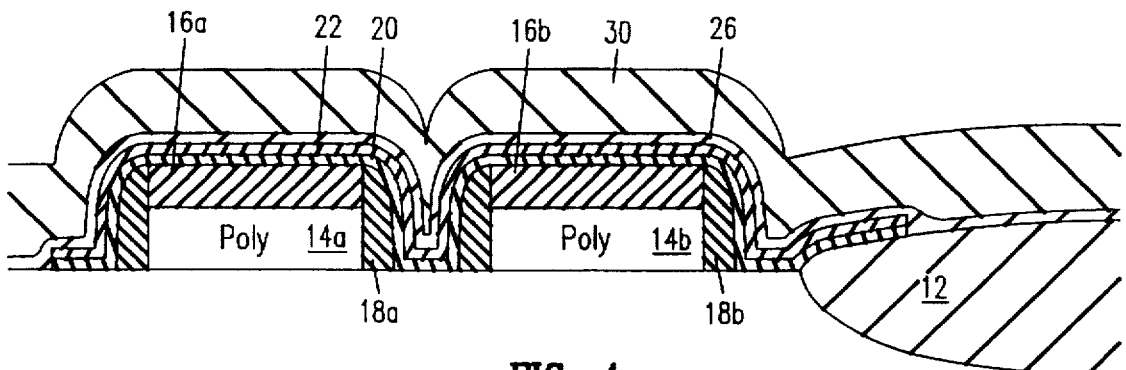
Figure 5:
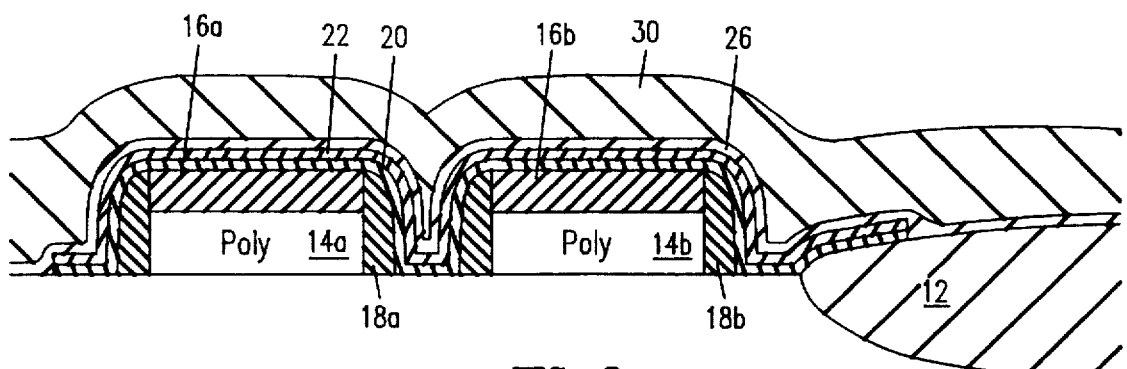

Next in FIG. 4, a layer of undoped silicon dioxide 26 is deposited using CVD, to a thickness of 700 Å to 1000 Å. Then a layer of BPSG 30 is deposited to a thickness of about 4300 Å. The wafer is then reflowed at 850–900° C. for 30 minutes under $N_2$. This reflow step provides a partially planarized surface as shown in FIG. 5.

Figure 6:
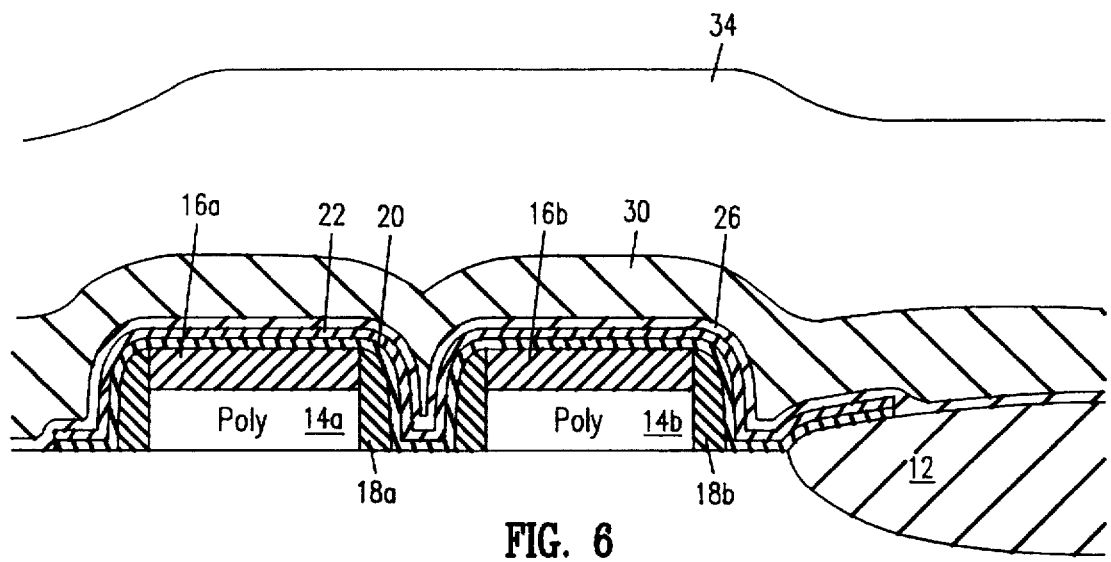
Figure 7:
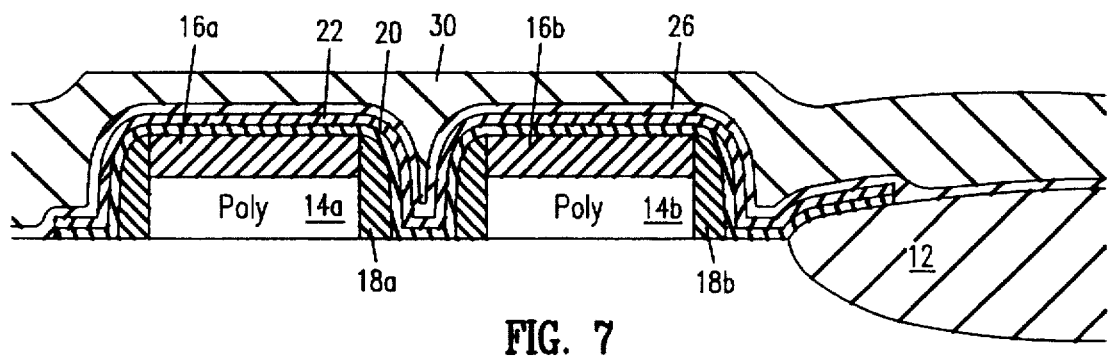

Improved planarization is achieved by using a resist etch back process. First, photoresist 34 is spun onto the wafer to a thickness of 9000 Å as shown in FIG. 6. After the wafer is baked at 300° C. for 30 minutes, the wafer is conventionally blanket etched to planarize the wafer so that over the active regions of the wafer BPSG layer 30 will have a planar upper surface, and approximately 1000 Å of photoresist layer 34 remains over the non active regions. The remaining photoresist is then stripped off the wafer, resulting in the structure shown in FIG. 7.

Figure 4A:
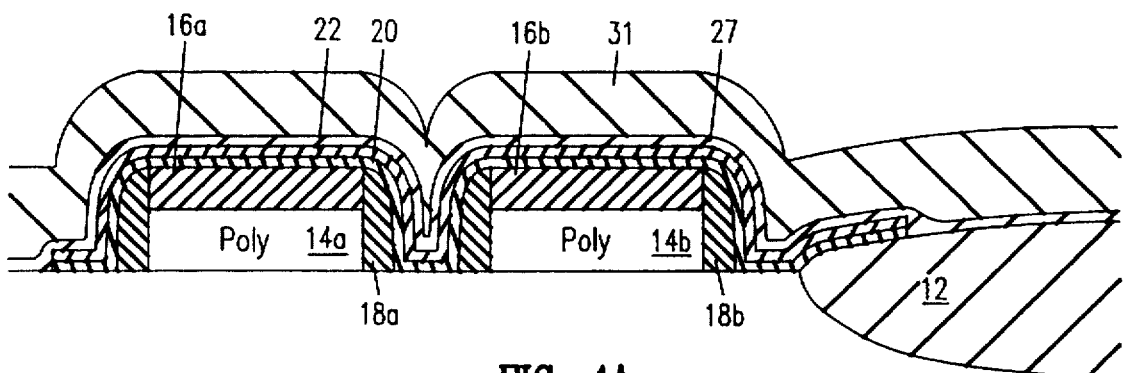
FIG. 4a shows in cross-section an alternative process step in fabricating a second embodiment of the invention.

A second embodiment of the invention achieves planarization using BPTEOS (Boro-Phospho-Tetraethylorthosilicate). Specifically, in FIG. 4a (an alternative to FIG. 4), undoped silicon dioxide layer 27 is deposited on the wafer to a thickness of 1000 Å, and BPTEOS layer 31 is deposited to a thickness of 9000 Å. The wafer is reflowed for 30 minutes at 875–900° C. under $N_2$. After reflowing, the surface of the wafer is fully planarized. The thickness of the BPTEOS layer is then reduced by between 4000 and 5000 Åusing a blanket etch by dipping the wafer into a conventional HF solution for approximately 14 minutes, resulting in a structure shown in FIG. 7.

An optional step of etching away the thin films which may have formed during processing on the backside of the wafer can be performed to provide a gettering effect.

Further processing of either the BPSG reflow or the BPTEOS embodiments continues identically.

Figure 8:
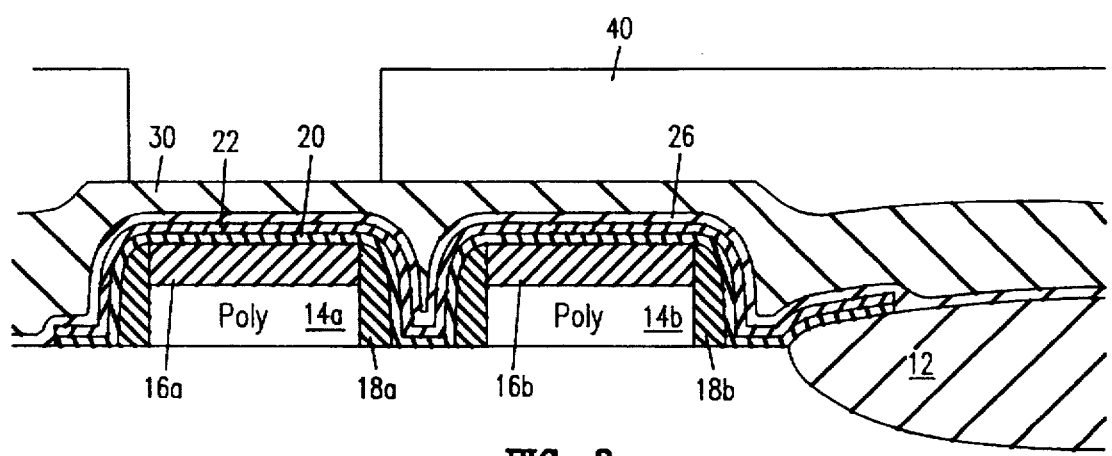
Figure 9:
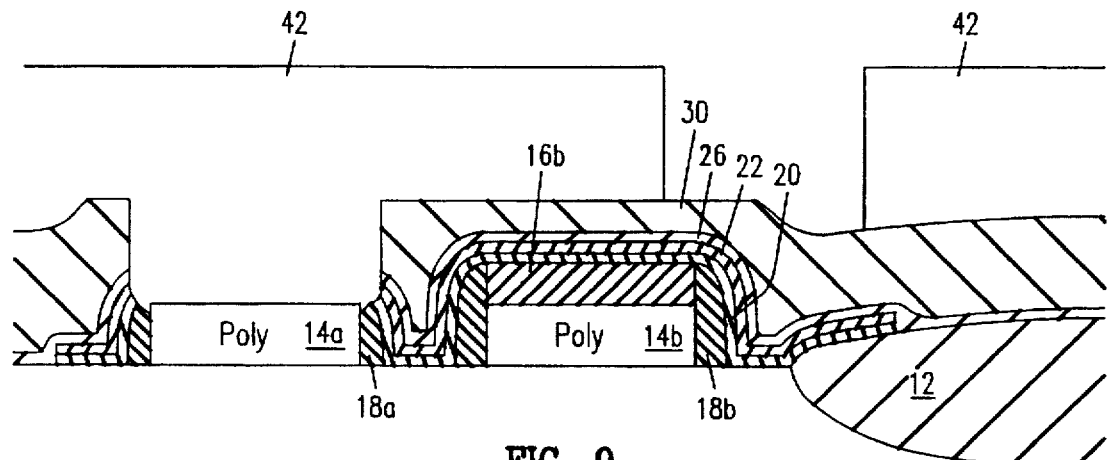

Photoresist layer 40 is placed on the wafer. The wafer is etched using a three step etching process with a polyiso mask, as shown in FIGS. 8 and 9. First the BPSG (or BPTEOS) layer 30 and oxide layer 26 are etched down to landing pad 22. Second, the landing pad is etched down to the oxide layer 20. Third, oxide layer 20 and nitride layer 16 are etched down to the polysilicon gate 14a.

Figure 10:
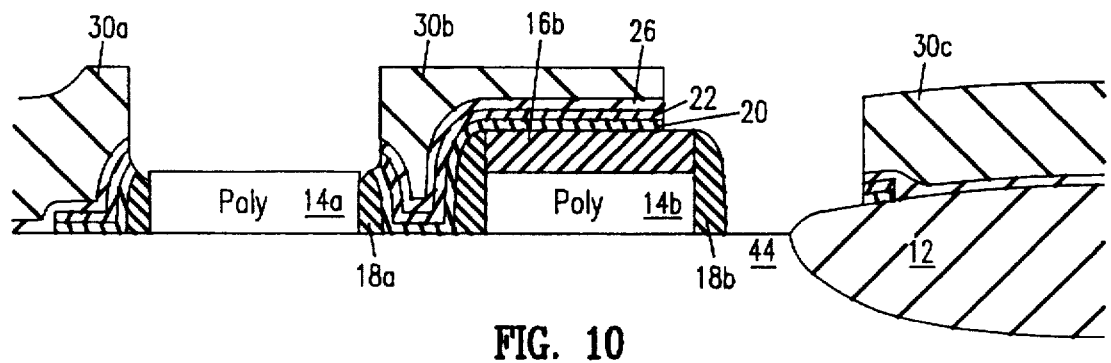

The photoresist layer 40 is then stripped from the wafer. After cleaning, a photoresist layer 42 is formed on the wafer. Then the wafer is etched using a three step process with a buried contact mask, as shown in FIGS. 9 and 10. First, the BPSG (or BPTEOS) layer 30 and oxide layer 26 are etched down to landing pad 22. Second, the landing pad 22 is etched down to the oxide layer 20. Third, oxide layer 20 is etched down to the substrate surface and transistor active region 44.

As shown in FIG. 10, gate 14a as well as active region 44 are exposed for connecting to each other. This process has divided BPSG (or BPTEOS) layer 30 into three separate portions 30a, 30b and 30c. The wafer between the gate 14a and active region 44 is locally planarized by BPSG (or BPTEOS) portion 30b.

Figure 11:
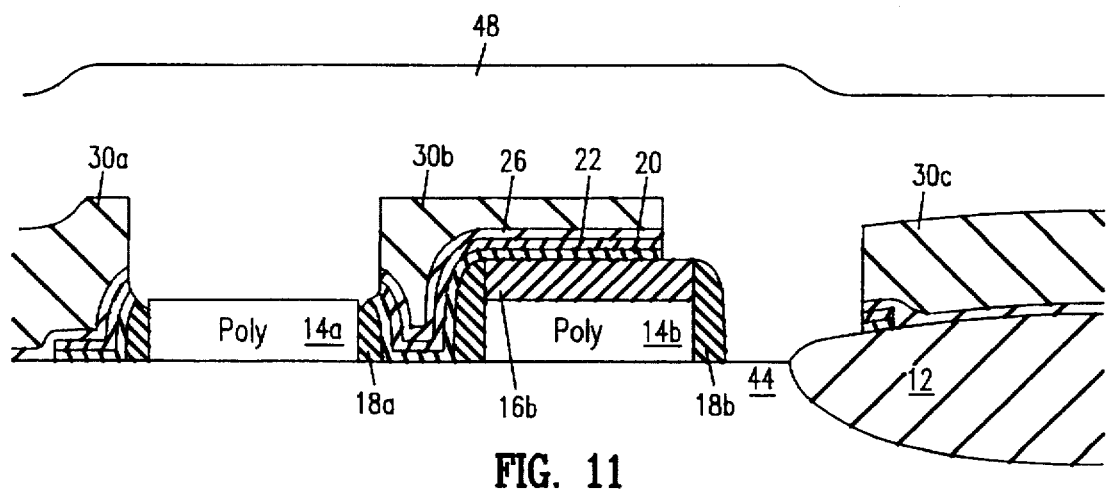

The wafer is then dipped in a 100:1 HF solution for approximately 45 seconds to blanket etch away about 20 Å of native oxide, which may have formed over the silicon portions due to oxidation. Then a layer of polysilicon 48 is deposited on the wafer to a thickness of about 6500 Å. As shown in FIG. 11, polysilicon layer 48 serves as poly plugs as well as an interconnect. The poly plugs to gate 14a as well as the poly plug to active region 44 must have at least one dimension less than 0.7 micron. Unlike conventional polysilicon plugs which were only used for vertical interconnects, layer 48 serves as both a vertical and as a horizontal interconnect between gate 14a and active region 44. Another advantage is that layer 48 is self-aligned with the active region 44 as well as the gate 14a.

Further processing of the wafer can be accomplished using either of two methods.

Figure 12:
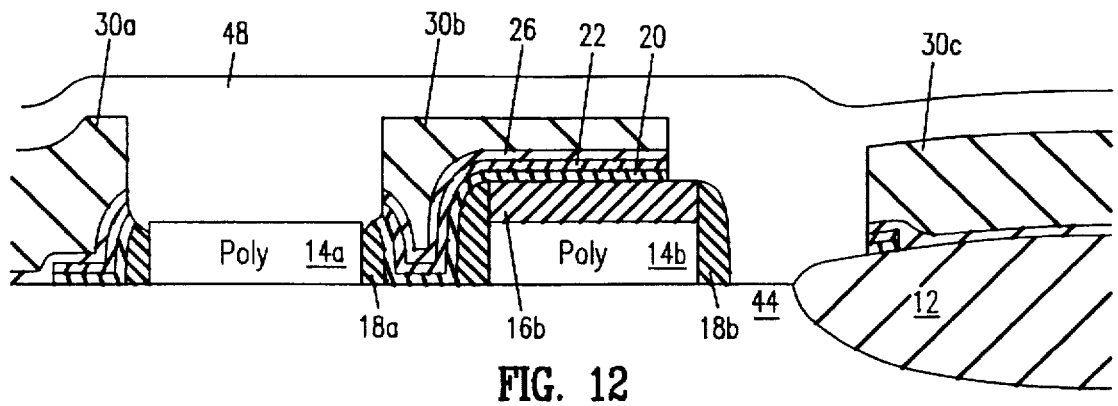

In the first method, polysilicon layer 48 is doped with a phosphorous source such as $PH_3$ or $POCl_3$ to reduce the sheet resistance to 100–300 ohm/sq. The wafer is then "deglazed" with a 7:1 HF solution for about 40 seconds to remove any silicon dioxide that may have formed on top of polysilicon layer 48. The wafer is then blanket etched in a conventional three step process of oxide break through, anisotropic etch to remove approximately 2250 Å of polysilicon layer 48 and an isotropic etch to remove approximately 2250 Å of polysilicon. The etching reduces the polysilicon layer 48 thickness by approximately 4500 Å, leaving polysilicon layer 48 with a thickness of 2000 Å above BPSG (or BPTEOS) portion 30b, as shown in FIG. 12.

Alternatively, the wafer can be conventionally etched back to reduce polysilicon layer 48 to a thickness of approximately 2000 Å above BPSG (or BPTEOS) portion 30b. Polysilicon layer 48 is then doped to the appropriate resistance.

Another option is to use a conventional etch back to reduce polysilicon layer 48 to a thickness of 0–500 Å above BPSG (or BPTEOS) portion 30b. The wafer is then redeposited with 1000–1500 Å of polysilicon which is then doped to the appropriate resistance.

Figure 13:
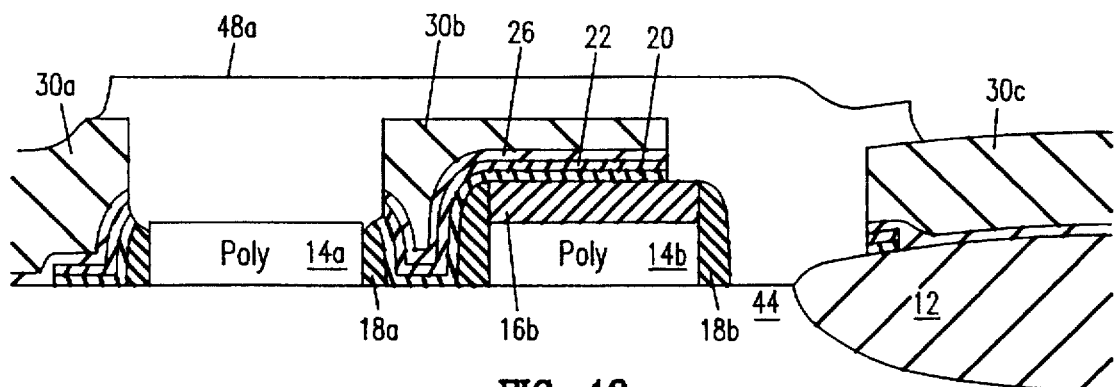

Next, polysilicon layer 48 is covered with photoresist (not shown) and masked with a standard poly 2 (second polysilicon layer) mask to form a polysilicon local interconnect. A conventional polysilicon etching step is used to define the poly 2 pattern. Ideally, the polysilicon overlaps BPSG (or BPTEOS) portions 30a and 30c by 0.1 to 0.2 microns. As shown in FIG. 13, polysilicon layer 48 is thereby reduced to polysilicon interconnect 48a.

After the wafer is conventionally cleaned, it is covered by sputtering a titanium layer (not shown) over the surface and forming a self-aligned silicide layer (not shown) so that only the polysilicon interconnect 48a is silicided. Any titanium present beyond the interconnect 48a is excess titanium which is subsequently stripped off. This provides a titanium silicide conductor 48a, with a planar upper surface, linking the active region 44 to the gate electrode 14a.

Figure 14:
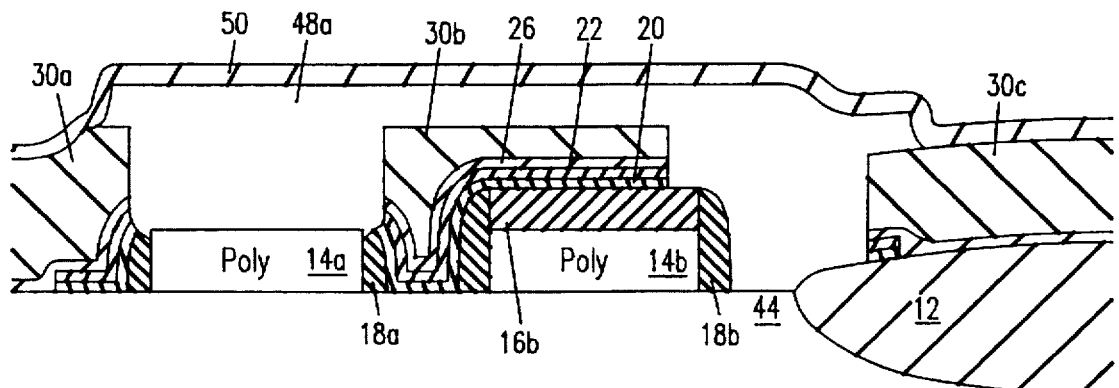
Figure 15:
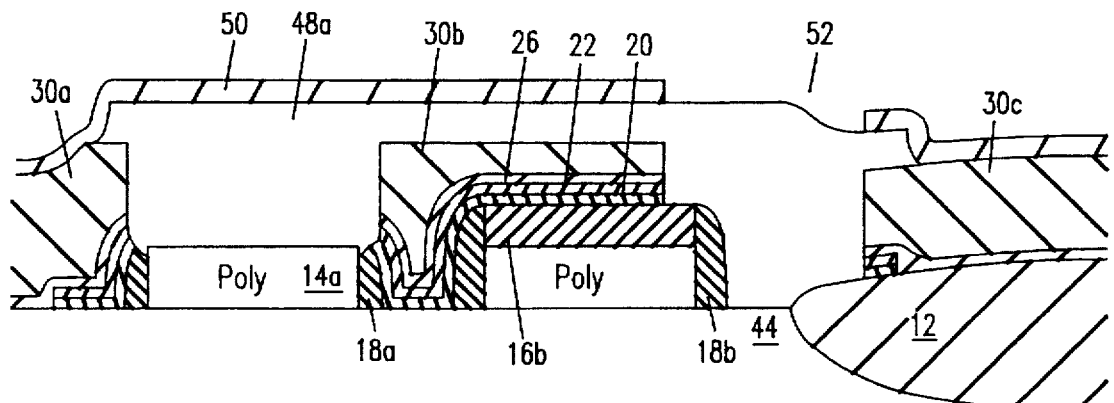
Figure 16:
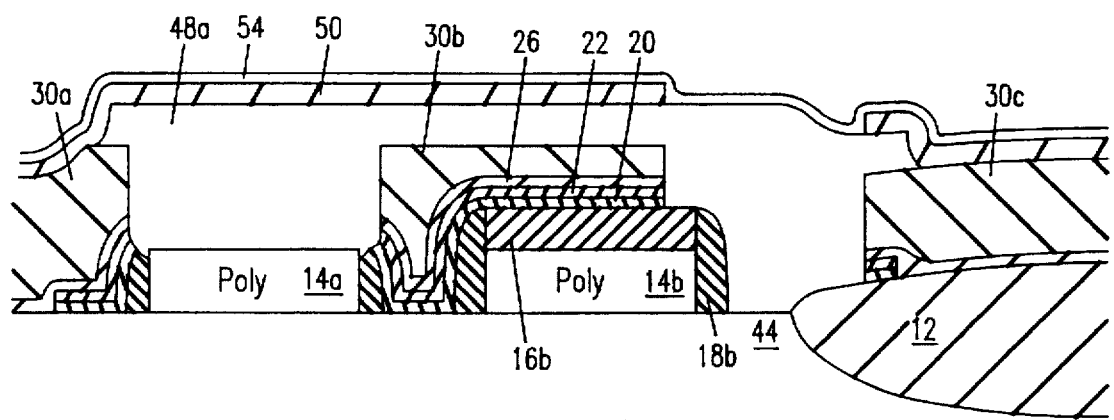
Figure 17:
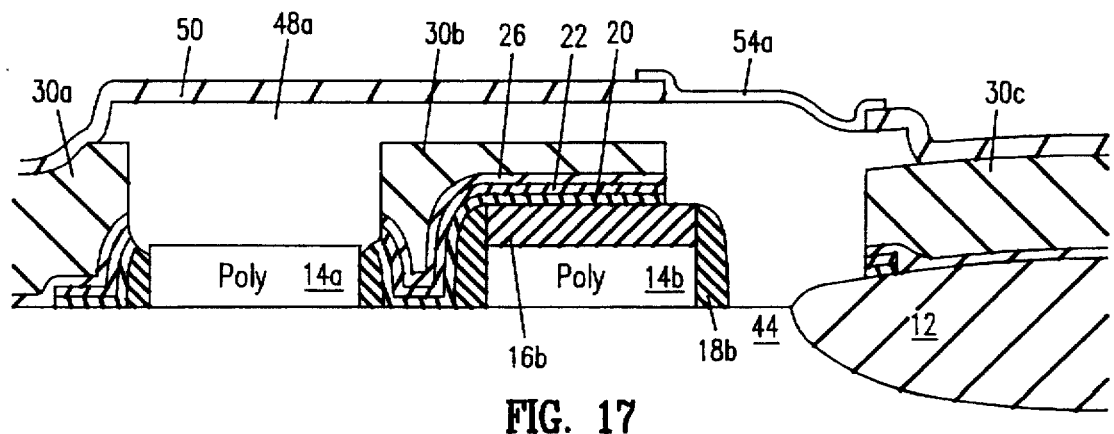

Then conventionally additional insulating and conductive layers are formed. As shown in FIG. 14, silicon dioxide layer 50 is formed on the wafer to a thickness of 750 Å. Next, in FIG. 15 a polysilicon via 52 is defined in the silicon dioxide layer 50. In FIG. 16, polysilicon layer 54 is deposited on the wafer to a thickness of approximately 150–300 Å. Next Polysilicon layer 54 is covered with photoresist (not shown) and masked with a standard poly 3 (third polysilicon layer) mask to form poly 3 layer 54. Then poly 3 layer 54 is etched to define the poly 3 pattern such as poly 3 contact 54a, as shown in FIG. 17. The poly 3 fabrication is described in U.S. Pat. No. 5,348,897 (incorporated herein by reference) issued Sep. 20, 1994 and entitled "Transistor Fabrication Methods Using Overlapping Masks."

It will be appreciated that alternate materials and techniques are usable. Also, the various process parameters and dimensions given herein are illustrative and not limiting. As described above, various other planarization methods are compatible with the invention. The planarizing filler material could also be PSG (a variation of BPSG) or any other suitable material. Also the local interconnect conductors need not be polycrystalline silicon, but could be formed using a variety of refractory metals, alloys, or silicides. Some metals such as aluminum, titanium, titanium nitride, and tungsten can be used only if the wafer is not subject to a temperature higher than 450° C. in subsequent processing.

The top side geometry of the structures in accordance with the invention are formed conventionally. For example the invention can be combined with the top side geometry of an SRAM cell as described in the above-referenced U.S. Pat. No. 5,166,771. However, it is also to be understood that the present invention is applicable to processes other than those described in the above referenced patent, for instance, to formation of any of the various types of MOS transistors in various types of integrated circuits such as microprocessors, memory cells, etc.

I claim:

1. A semiconductor device structure formed on a substrate having a principal surface, comprising:

a plurality of spaced apart gate structures formed on the principal surface, an insulator being formed on lateral surfaces of a conductive electrode of each gate structure;

a plurality of doped regions formed in the substrate, each doped region adjoining an adjacent gate structure and extending from the principal surface into the substrate;

an insulating layer extending over an upper surface of a first of the gate structures and over a portion of the principal surface lying between the first gate structure and an adjacent second gate structure;

a filler layer overlying the insulating layer, the filler layer planarizing an upper surface of the integrated circuit;

a conductive electrical contact overlying the first gate structure, the filler layer, and the second gate structure, the conductive electrical contact making electrical contact to an upper surface of the conductive electrode of the second gate structure and to at least one of the doped regions at the principal surface of the substrate; and an etch resistant landing pad layer over the insulating later, wherein the etch resistant landing pad layer is under the filler layer and is etch resistant with regard to etching of the filler layer.

2. The structure of claim 1, wherein the filler layer is a doped glass.

3. The structure of claim 2, wherein the doped glass is boro-phosphosilicate glass.

4. The structure of claim 1, wherein the insulator on the lateral surfaces of the gate structures is silicon dioxide.

5. The structure of claim 1, wherein the etch resistant landing pad layer is an insulating material.

6. The structure of claim 5, wherein the insulating material is silicon nitride.

7. The structure of claim 5, wherein the insulating material is oxynitride.

8. The structure of claim 1, wherein the conductive electrical contact is doped polysilicon.

9. The structure of claim 1, wherein the conductive electrical contact is a silicide.

10. The structure of claim 1, wherein the conductive electrical contact is aluminum.

11. The structure of claim 1, wherein the conductive electrical contact is self-aligned with the upper surface of the conductive electrode of the second gate structure and the at least one of the doped regions.

12. The structure of claim 1, wherein the conductive electrical contact forms poly-plugs and a horizontal interconnect which planarizes the entire surface of the semiconductor device structure.

13. The structure of claim 12, wherein the poly-plugs have at least one dimension less than 0.7 microns.

14. The structure of claim 1, further comprising:
a second insulating layer over the planar upper surface of the conductive electrical contact; and
a contact via extending through the second insulating layer to the conductive electrical contact.

15. The structure of claim 1, further comprising a first filler portion adjacent to the second gate structure and a second filler portion adjacent to at least one of the doped regions, wherein the conductive electrical contact extends over the first filler portion and the second filler portion by less than 0.2 micron.

16. The structure of claim 1, wherein the filler layer extends over a portion of the first gate structure.

17. The structure of claim 1, wherein the filler layer has a planar upper surface.

18. A semiconductor device structure formed on a substrate having a principal surface, comprising:
a plurality of spaced apart gate structures formed on the principal surface, an insulator being formed on lateral surfaces of a conductive electrode of each gate structure;

a plurality of doped regions formed in the substrate, each doped region adjoining an adjacent gate structure and extending from the principal surface into the substrate;

an insulating layer extending over an upper surface of a first of the gate structures and over a portion of the principal surface lying between the first gate structure and an adjacent second gate structure;

a filler layer overlying the insulating layer, the filler layer planarizing an upper surface of the integrated circuit;

a conductive electrical contact, having a planar upper surface, overlying the first gate structure, the filler layer, and the second gate structure, the conductive electrical contact making electrical contact to an upper surface of the conductive electrode of the second gate structure and to at least one of the doped regions at the principal surface of the substrate; and an etch resistant landing pad layer over the insulating layer, wherein the etch resistant landing pad layer is polysilicon.

19. A semiconductor device structure formed on a substrate having a principal surface, comprising:
a plurality of spaced apart gate structures formed on the principal surface, an insulator being formed on lateral surfaces of a conductive electrode of each gate structure;

a plurality of doped regions formed in the substrate, each doped region adjoining an adjacent gate structure and extending from the principal surface into the substrate;

an insulating layer extending over an upper surface of a first of the gate structures and over a portion of the principal surface lying between the first gate structure and an adjacent second gate structure;

a filler layer with a planar upper surface overlying the insulating layer, the filler layer planarizing an upper surface of the integrated circuit and extending over a portion of the first gate structure; and a conductive electrical contact, overlying the first gate structure, the filler layer, and the second gate structure, the conductive electrical contact making electrical contact to an upper surface of the conductive electrode of the second gate structure and to at least one of the doped regions at the principal surface of the substrate.

20. The structure of claim 19, wherein the filler layer is a doped glass.

21. The structure of claim 20, wherein the doped glass is boro-phosphosilicate glass.

22. The structure of claim 19, wherein the insulator on the lateral surfaces of the gate structures is silicon dioxide.

23. The structure of claim 19, further comprising an etch resistant landing pad layer over the insulating layer, wherein the etch resistant landing pad layer is under the filler layer.

24. The structure of claim 23, wherein the etch resistant landing pad is an electrically insulating material.

25. The structure of claim 24, wherein the insulating material is silicon nitride.

26. The structure of claim 24, wherein the insulating material is oxynitride.

27. A semiconductor device structure formed on a substrate having a principal surface, comprising:
a plurality of spaced apart gate structures formed on the principal surface, an insulator being formed on lateral surfaces of a conductive electrode of each gate structure;

a plurality of doped regions formed in the substrate, each doped region adjoining an adjacent gate structure and extending from the principal surface into the substrate;

an insulating layer extending over an upper surface of a first of the gate structures and over a portion of the principal surface lying between the first gate structure and an adjacent second gate structure;

a filler layer with a planar upper surface overlying the insulating layer, the filler layer planarizing an upper surface of the integrated circuit and overlying the first gate structure;

a conductive electrical contact, overlying the first gate structure, the filler layer, and the second gate structure, the conductive electrical contact making electrical contact to an upper surface of the conductive electrode of the second gate structure and to at least one of the doped regions at the principal surface of the substrate; and an etch resistant landing pad layer over the insulating layer, wherein the etch resistant landing pad is polysilicon.

* * * * *